(12) United States Patent
Golat et al.

(10) Patent No.: US 10,236,836 B1
(45) Date of Patent: Mar. 19, 2019

(54) TUNED AMPLIFIER MATCHING BASED ON BAND SWITCH SETTING

(71) Applicant: pSemi Corporation, San Diego, CA (US)

(72) Inventors: Joseph Golat, Crystal Lake, IL (US); David Kovac, Arlington Heights, IL (US); Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/829,683

(22) Filed: Dec. 1, 2017

(51) Int. Cl.
*H03F 3/191* (2006.01)
*H03F 3/193* (2006.01)
*H03F 1/08* (2006.01)

(52) U.S. Cl.
CPC ............. *H03F 3/191* (2013.01); *H03F 1/086* (2013.01); *H03F 3/193* (2013.01); *H03F 2200/417* (2013.01); *H03F 2200/421* (2013.01); *H03F 2201/3233* (2013.01)

(58) Field of Classification Search
CPC ........................................ H03F 3/191
USPC ................................. 330/302, 305
See application file for complete search history.

(56) References Cited

U.S. PATENT DOCUMENTS

| | | | |
|---|---|---|---|
| 7,248,120 B2 | 7/2007 | Burgener et al. | |
| 7,715,813 B2 * | 5/2010 | Heng | H03J 3/28 455/150.1 |
| 9,024,700 B2 | 5/2015 | Ranta | |
| 9,197,194 B2 | 11/2015 | Reedy et al. | |
| 9,276,527 B2 | 3/2016 | Gaynor | |
| 9,294,056 B2 | 3/2016 | Nobbe et al. | |
| 9,602,063 B2 | 3/2017 | Kaatz et al. | |
| 9,647,631 B2 | 5/2017 | Gaynor | |
| 9,712,197 B2 | 7/2017 | Ripley et al. | |
| 2015/0326326 A1 | 11/2015 | Nobbe et al. | |
| 2016/0164547 A1 * | 6/2016 | Kim | H04B 1/0057 455/266 |
| 2016/0211820 A1 * | 7/2016 | Bagger | H04B 1/0057 |
| 2017/0346516 A1 | 11/2017 | Ripley et al. | |
| 2018/0146541 A1 * | 5/2018 | Chen | H04B 1/3838 |
| 2018/0152945 A1 * | 5/2018 | Balteanu | H04W 72/0453 |

* cited by examiner

*Primary Examiner* — Henry Choe
(74) *Attorney, Agent, or Firm* — Jaquez Land Greenhaus LLP; Martin L. Jaquez, Esq.; Alessandro Steingl, Esq.

(57) ABSTRACT

Methods and devices for tuning a configurable amplifier of a multi-band RF front-end stage based on a setting of a band switch are described. A lookup table provided with the configurable amplifier is used to map configuration control data of the band switch to configuration control data of the configurable amplifier. The configurable amplifier can be part of a transmit path or a receive path of the multi-band RF front-end stage.

14 Claims, 12 Drawing Sheets

TUNED AMPLIFIER MATCHING BASED ON BAND SWITCH SETTING

CROSS REFERENCE TO RELATED APPLICATIONS

Cross-Reference to Related Tunable Circuits Applications

The present application may also be related to U.S. Pat. No. 9,294,056 entitled "Scalable Periphery Tunable Matching Power Amplifier", issued Mar. 22, 2016, the disclosure of which is incorporated herein by reference in its entirety. The present application may also be related to U.S. Pat. No. 9,602,063 entitled "Variable Impedance Match and Variable Harmonic Terminations for Different Modes and Frequency Bands", issued Mar. 21, 2017, the disclosure of which is incorporated herein by reference in its entirety. The present application may also be related to U.S. Pat. No. 9,647,631 entitled "Tunable Impedance Matching Network", issued May 9, 2017, the disclosure of which is incorporated herein by reference in its entirety. The present application may also be related to U.S. patent application Ser. No. 14/042,312, filed on Sep. 30, 2013, entitled "Methods and Devices for Impedance Matching in Power Amplifier Circuits", the disclosure of which is incorporated herein by reference in its entirety. The present application may also be related to U.S. patent application Ser. No. 14/272,387, filed on May 7, 2014, entitled "RF Transmit Path Calibration via On-Chip Dummy Load", the disclosure of which is incorporated herein by reference in its entirety.

Cross-Reference to Related Tunable Elements Applications

The present application may be related to U.S. Pat. No. 9,024,700 B2 entitled "Method and Apparatus for use in Digitally Tuning a Capacitor in an Integrated Circuit Device", issued May 5, 2015, the disclosure of which is incorporated herein by reference in its entirety. The present application may also be related to No. U.S. Pat. No. 9,197,194 B2 entitled "Method and Apparatus for Use in Tuning Reactance in an Integrated Circuit Device", issued Nov. 24, 2015, the disclosure of which is incorporated herein by reference in its entirety.

TECHNICAL FIELD

The present teachings relate to RF (radio frequency) circuits. More particularly, the present teachings relate to methods and apparatuses for tuning of RF circuits.

BACKGROUND

Radio frequency (RF) devices, such as cell phone transmitters, are becoming increasingly complex due to requirements to operate according to different modes of operation associated with, for example, additional frequency bands, more complex modulation schemes, higher modulation bandwidths, and the introduction of data throughput improvement schemes such as simultaneous RF transmission and/or reception within a same or different, but closely spaced, bands or channels within a band (e.g. voice, data), and aggregate transmission wherein information is multiplexed over parallel RF transmissions.

In order to support such different modes of operation, use of mode specific amplifiers may be one option. However, as the number of modes increases, such an approach may become too costly and unpractical. For example, considering the high number of different frequency bands that an RF device, such as a cell phone transmitter, may need to support, the traditional approach of adding band specific narrow band amplifiers for each of the supported frequency bands may be prohibitive due to its high cost and required large physical size. Rather, current implementations support the high number of different frequency bands by way of a combination of one or more wide band amplifiers, each capable of supporting several frequency bands, and narrow band filters that are selectively coupled at the output of the wide band amplifiers based on a selected band of operation. Although such configuration solves problems associated with usage of band specific narrow band amplifiers, performance of the RF device as measured, for example, by a power output, or power added efficiency (PAE), may be degraded. It is therefore an object of the present disclosure to provide a solution to the traditional approach of using mode specific amplifiers while reducing a performance degradation associated with the provided solution.

SUMMARY

According to a first aspect of the present disclosure, a radio frequency (RF) circuital arrangement configured to process an RF signal for operation over a plurality of frequency bands is presented, the circuital arrangement comprising: a configurable amplifier configured to be tuned according to any one of the plurality of frequency bands; and a band switch configured to selectively couple the configurable amplifier to a filter of a plurality of narrow band filters based on a switch control signal provided to the band switch, wherein the plurality of narrow band filters are respectively associated, in a one to one correspondence, to the plurality of frequency bands; and wherein a tuning of the configurable amplifier is based on the switch control signal According to a second aspect of the present disclosure, a radio frequency (RF) device configured to transmit and receive RF signals according to a plurality of frequency bands is presented, the device comprising at least one of: a) a configurable transmit path coupled to an antenna and configured to transmit RF signals according to the plurality of frequency bands, the configurable transmit path comprising the radio frequency (RF) circuital arrangement according to claim 1, wherein the configurable amplifier is a power amplifier; and b) a configurable receive path coupled to the antenna and configured to receive RF signals according to the plurality of frequency bands, the configurable receive path comprising the radio frequency (RF) circuital arrangement according to claim 1, wherein the configurable amplifier is a low noise amplifier.

According to a third aspect of the present disclosure, a method for increasing performance of a multi-band radio frequency (RF) device, the multi-band RF device operating over a plurality of frequency bands, is presented, the method comprising: determining a correspondence between data values of a switch control signal to a band switch and the plurality of frequency bands; providing a configurable amplifier that is configured to be tuned according to any one of the plurality of frequency bands; mapping the data values of the switch control signal to data values of a configuration control signal to the configurable amplifier; and based on the mapping, tuning the configurable amplifier for operation over any one of the plurality of frequency bands, thereby increasing performance of the multi-band RF device.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Figure 1:
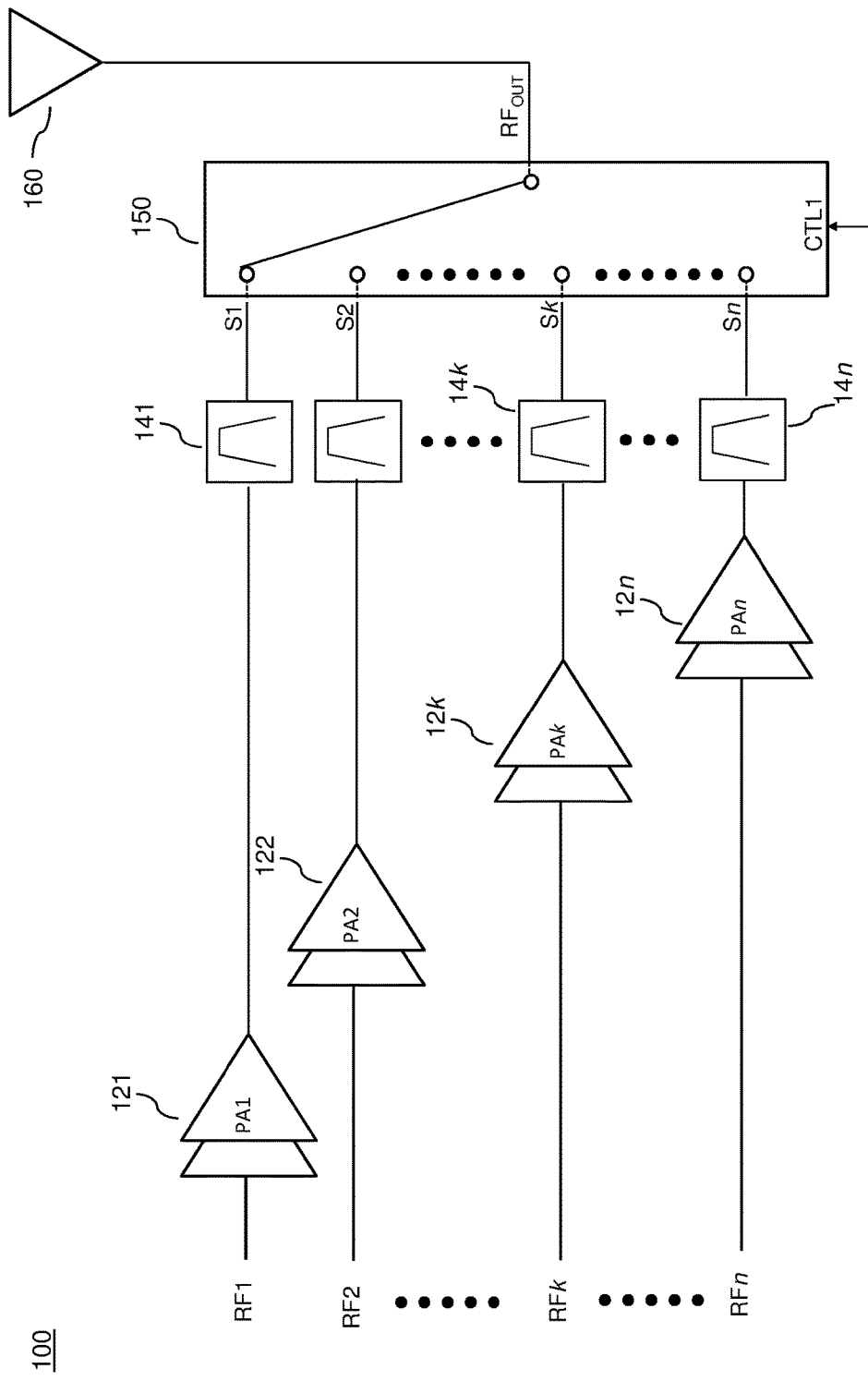
FIG. 1 shows a block diagram of transmit paths of a prior art multi-mode RF front-end stage of an RF device, as used, for example, in a cellular phone, where band specific narrow band amplifiers are used for each transmit path to support each band of multiple bands.

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronics devices (e.g., cell phones, radios) having a plurality of devices, such as for example, transistors (e.g., MOSFETs). Persons skilled in the art will appreciate that such electrical circuits comprising transistors can be arranged as amplifiers.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers are described for example in U.S. Pat. No. 7,248,120, issued on Jul. 24, 2007, entitled "Stacked Transistor Method and Apparatus", the disclosure of which is incorporated herein by reference in its entirety. As used herein, the term "amplifier" can also be applicable to amplifier modules and/or power amplifier modules having any number of stages (e.g., pre-driver, driver, final), as known to those skilled in the art.

As used in the present disclosure, the term "mode" can refer to a wireless standard and its attendant modulation and coding scheme or schemes. As different modes may require different modulation schemes, these may affect required channel bandwidth as well as affect the peak-to-average-ratio (PAR), also referred to as peak-to-average-power-ratio (PAPR), as well as other parameters known to the skilled person. Examples of wireless standards include Global System for Mobile Communications (GSM), code division multiple access (CDMA), Worldwide Interoperability for Microwave Access (WiMAX), Long Term Evolution (LTE), as well as other wireless standards identifiable to a person skilled in the art. Examples of modulation and coding schemes include binary phase-shift keying (BPSK), quadrature phase-shift keying (QPSK), quadrature amplitude modulation (QAM), 8-QAM, 64-QAM, as well as other modulation and coding schemes identifiable to a person skilled in the art.

As used in the present disclosure, the terms "channel" and "band" are used interchangeably and can refer to a frequency range. More in particular, the terms "channel" and "band" as used herein refers to a frequency range that can be defined by a wireless standard such as, but not limited to, wideband code division multiple access (WCDMA) and long term evolution (LTE). In some cases, a frequency range of a band may be representative of frequencies of operation of a mode, and a frequency range of a channel may be contained within the frequency range of the band.

FIG. 1 shows a simplified block diagram of a prior art RF front-end stage (100) which can be used for RF transmission of multiple modes and multiple frequency bands signals via an antenna (160). A person skilled in the art would realize that the block diagram depicted in FIG. 1 may also include receive paths coupled to antenna (160) for RF reception of the multiple modes and multiple frequency band signals via the same antenna (160). A more detailed description of such RF front-end stage can be found, for example, in the above referenced U.S. patent application Ser. No. 14/272,387, the disclosure of which is incorporated herein by reference in its entirety.

As can be seen in FIG. 1, an antenna switch (160) may be used to switch one of a plurality of RF signals (RF1, RF2, RFn) to be transmitted to the antenna (160). According to an exemplary case, each of the plurality of RF signals (RF1, RF2, RFn) may be associated to a different band of operation (B1, B2, Bn) defined by a corresponding frequency range of operation, i.e. bandwidth, (BW1, BW2, BWn).

A transmit path for each RF signal of the plurality of RF signals (RF1, RF2, RFn) depicted in FIG. 1 may include an amplifier (PA1, PA2, PAn), also referred to in the FIG. 1 as (121, 122, . . . , 12n), that is tuned to operate at the frequency range of operation (BW1, BW2, BWn) of the RF signal (RF1, RF2, RFn). The amplifier (PA1, PA2, PAn) may be coupled to a narrow band filter (141, 142, . . . , 14n) that is configured to pass the frequency range of operation (BW1, BW2, BWn) of the RF signal (RF1, RF2, RFn) while blocking/attenuating frequencies outside the band of operation that may be output by the amplifier (PA1, PA2, PAn) and therefore interfere with other paths/circuits of the RF front-end stage (100). A person skilled in the art would understand that the narrow band filter (141, 142, . . . , 14n) may be part of a duplexer unit that is configured to limit a frequency range output by a transmit path, as well as to limit a frequency range that is received by a receive path. As known to a person skilled in the art, the duplexer unit may allow duplex operation (i.e., simultaneous transmit and receive) of the RF front-end stage (100) over a same or different supported frequency bands.

With continued reference to FIG. 1, the antenna switch (150) is shown in a position that switches the RF1 signal that is amplified via the amplifier PA1 (121), filtered via the narrow band filter (141), and fed to the antenna switch (150) terminal S1, to the antenna (160). The position of the antenna switch (150), is controlled via a configuration control signal CTL1 that is provided by a system controller aware of a desired mode/band of operation of the front-end stage (100). As known to a person skilled in the art, such system controller may be a transceiver unit (e.g. 810 of FIG. 8A and FIG. 8B later described).

As noted above, with a demand towards higher supported number of modes of operation, such as, for example, higher number of bands of operation, the architecture used by the RF front-end (100) depicted in FIG. 1 may pose scalability issues that may render its implementation undesirable. Some such issues may be its higher cost and larger required physical area to support the additional band specific amplifiers. In order to address such issues, designs have emerged that use a single wideband amplifier to support several bands of operation, as shown in FIG. 2.

Figure 2:
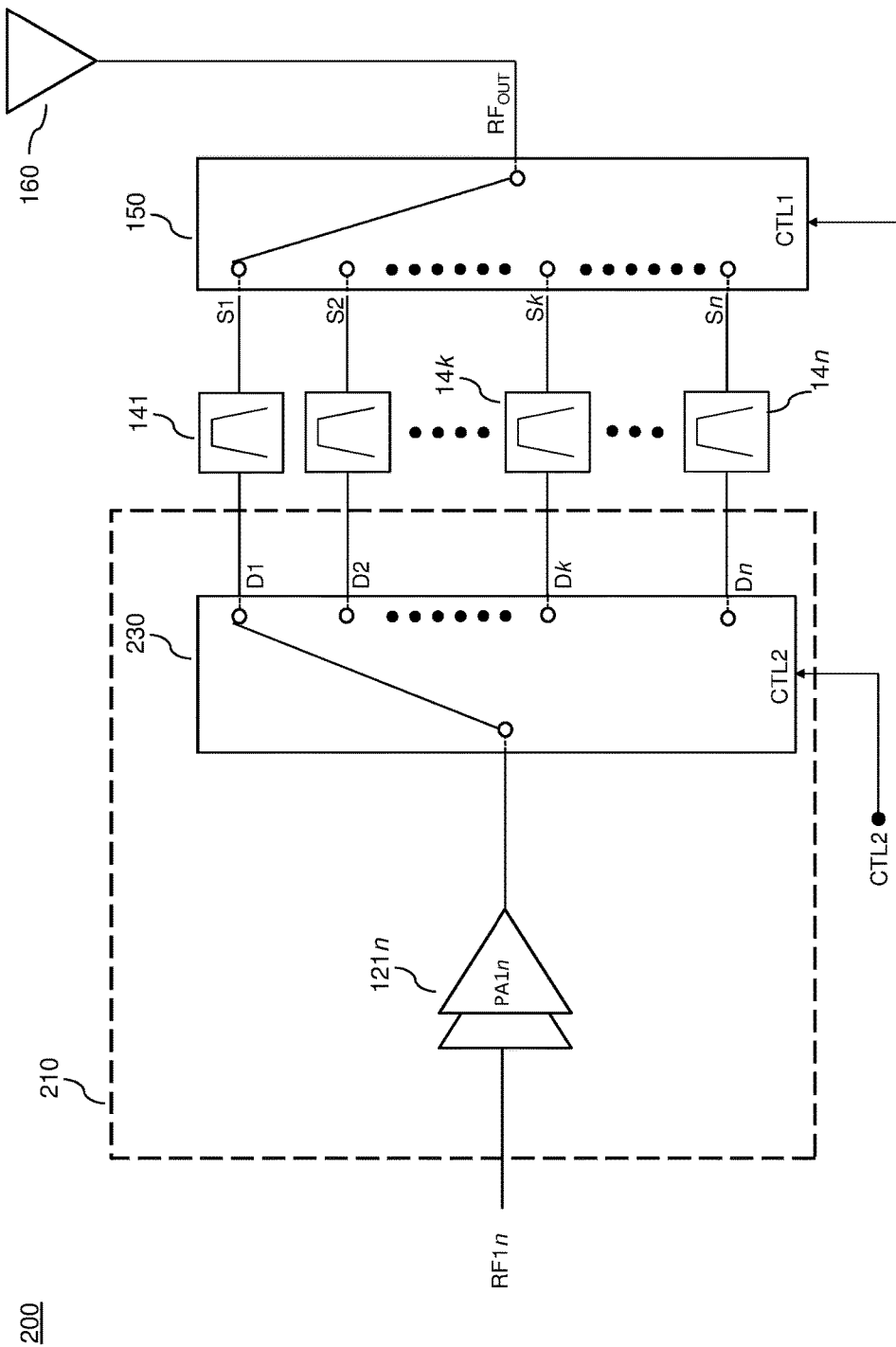
FIG. 2 shows a block diagram of transmit paths of a prior art multi-mode RF front-end stage of an RF device, as used, for example, in a cellular phone, where a multi-band wide-band amplifier is used to support multiple bands.

FIG. 2 shows a simplified block diagram of a prior art RF front-end stage (200) which can be used for RF transmission of multiple modes and multiple frequency bands signals via an antenna (160). A person skilled in the art would realize that the block diagram depicted in FIG. 2 is similar to one depicted in FIG. 1 with the difference that the RF signals (RF1, RF2, RFn) of the plurality of supported bands of operation (B1, B2, Bn) are transmitted to the antenna (160) via a single wideband amplifier PA1n (121n) whose output is selectively switched, via a band switch (230), to one of the narrow band filters (141, 142, . . . , 14n). In some implementations, the wideband amplifier PA1n (121n) and the band switch (230) may be monolithically integrated as single integrated circuit (210).

As can be seen in FIG. 2, an RF signal, RF1n, that may operate according to any one of the supported band of operation (B1, B2, Bn), is provided to a single wideband amplifier PA1n (121n) that is tuned to operate over a wide frequency range of operation that encompasses all the supported bands of operation (B1, B2, Bn). In other words, the frequency ranges of operation (BW1, BW2, BWn) of the supported bands of operation (B1, B2, Bn) are encompassed within a frequency range of operation, BW, of the single wideband amplifier PA1n (121n). A signal-aware system controller may configure the front-end (200) for operation over one of the supported bands (B1, B2, Bn) by selecting a frequency content of the RF signal, RF1n, and accordingly controlling position of the band switch (230) and position of the antenna switch (150). For example, FIG. 2 depicts the exemplary operation over a first band of operation (e.g. B1), where: the content of the RF signal, RF1n, is according to the frequency range of operation of the first band of operation (e.g. RF1n=RF1, with frequency content per BW1); position of the band switch (230) is so to route the amplified RF signal to the narrow band pass filter (141) associated with the band of operation B1; and position of the antenna switch (150) is so to route the output of the filter (141) to the antenna (160) for transmission. It should be noted that the configuration control signals (e.g. CTL1, CTL2 of FIGS. 1, 2) output by the signal-aware controller (e.g. transceiver) may be routed via a same or separate set of physical conductive lines and according to any interface/control protocol known to a person skilled in the art. Such interface/control protocol may dictate type and format associated to the used signals (e.g. signal levels and data formats such as words, bytes, bits, etc. which can be associated with values of the signals). Separate conductive lines shown in the various figures of the present disclosure should therefore not be considered as limiting the scope of the disclosure.

With further reference to FIG. 2, it should be noted that support of the all the bands of operation (B1, B2, Bn) may be provided by more than a single wideband amplifier PA1n (121n), as shown, for example, in FIG. 8B later described. In such configuration, the supported bands of operation may be grouped in one or more groups, each group operating via a wideband amplifier that is tuned for operation over all the frequency ranges of operation of the bands in the group. For example, as shown in FIG. 8B, the bands may be grouped according to three groups, respectively supporting bands (B1, Bk), (Bk+1, Bm) and (Bm+1, Bn).

Figure 3:
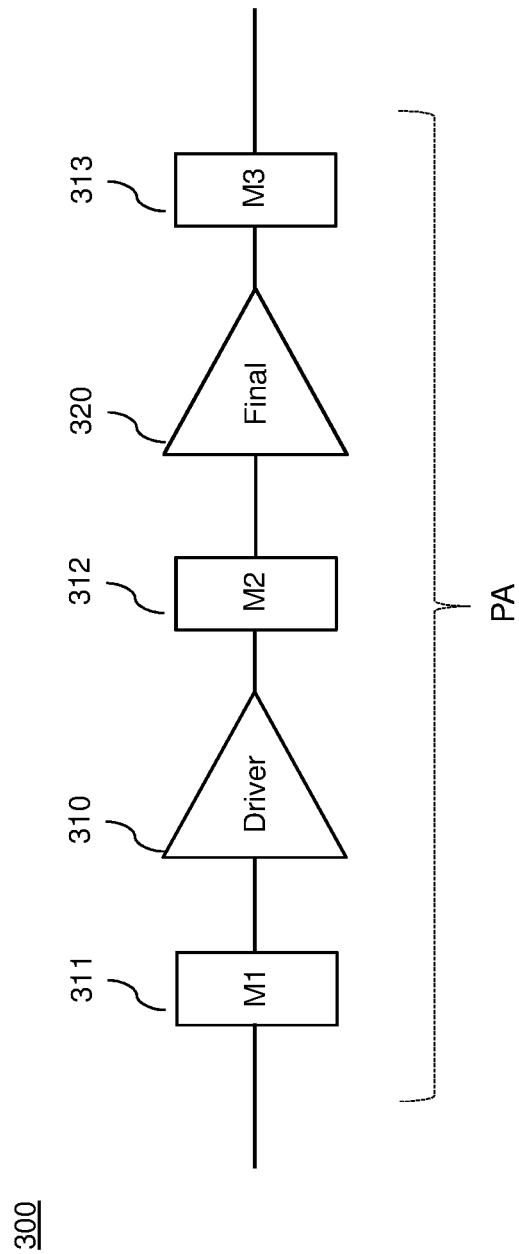
FIG. 3 shows an exemplary embodiment of an RF amplifier module which can be used in the multi-band RF front-end stages depicted in FIG. 1 and FIG. 2.

FIG. 3 shows an exemplary power amplifier module PA (300) which can be used in the multi-band RF front-end stage (100) of FIG. 1 as any of the amplifiers (PA1, PAn), and in the multi-band RF front-end stage (200) of FIG. 2 as the amplifier PA1n (121n). As can be seen in FIG. 3, the power amplifier module PA (300) comprises a driver amplifier (310) and a final amplifier (320) that are coupled to one another via an intermediate impedance match network (312). An input (impedance) match network (311) couples an input to the driver amplifier (310) to a preceding stage (not shown), and an output (impedance) match network (313) couples an output of the final amplifier (320) to a following stage (not shown).

With continued reference to the amplifier module PA (300) of FIG. 3, a person skilled in the art is well aware of such amplifier module topology and the benefits provided by the match networks (311, 312, 313), including impedance matching between coupled stages at frequency ranges of interest for an increase in transmitted signal level and decrease in reflected signal level between coupled stages. In particular, when used in the RF front-end stage (100) of FIG. 1 as any of the amplifiers (PA1, PA2, PAn), the output match network (313) is configured to match impedance between the final amplifier (320) and one of the filters (141, 142, . . . , 14n) over a frequency range of operation of a (single) corresponding band (B1, B2, Bn). On the other hand, when used in the RF front-end stage (200) of FIG. 2 as the amplifier PA1n (121n), the output match network (313) is configured to match impedance between the final amplifier (320) and any of the filters (141, 142, ..., 14n) over a frequency range of operation of any corresponding band (B1, B2, Bn).

Figure 4B:
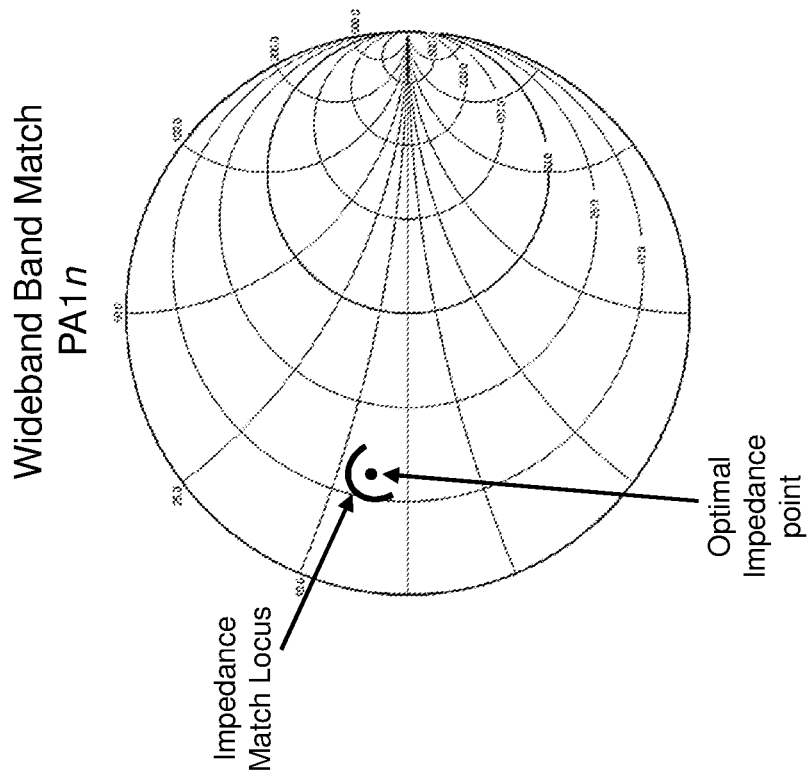
FIG. 4B shows a graph representing a Smith chart of an impedance matching locus for the wideband amplifier used in the multi-band RF front-end stage of FIG. 2.
Figure 4A:
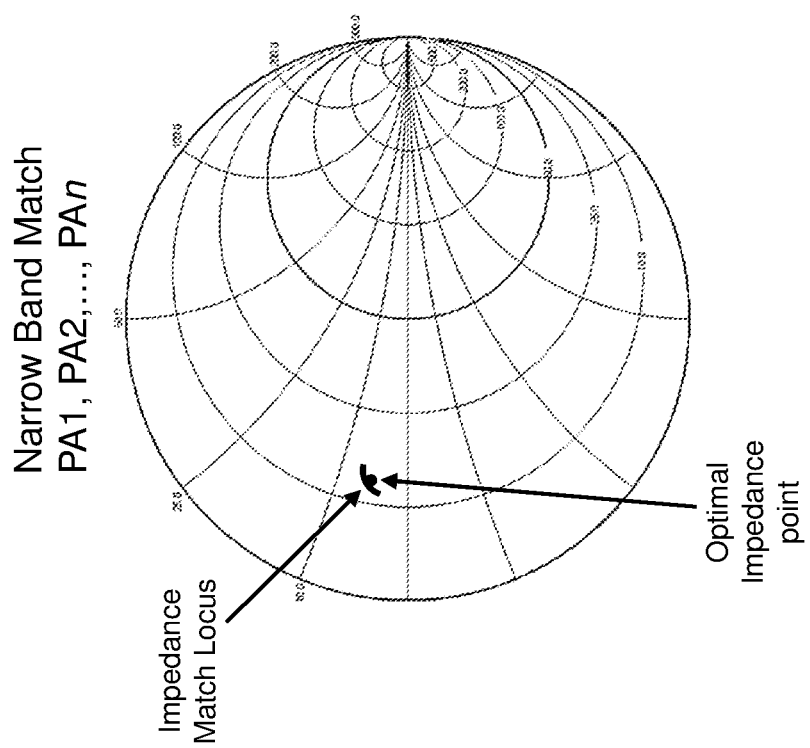
FIG. 4A shows a graph representing a Smith chart of an impedance matching locus for the narrow band amplifier used in the multi-band RF front-end stage of FIG. 1.

Based on the above, it would be clear to a person skilled in the art that one of the advantages of using the band specific amplifiers (PA1, PA2, PAn) as depicted in FIG. 1, is that each such amplifier is tuned (e.g. impedance matched) to operate at a relatively narrow frequency range of operation (e.g. one of BW1, BW2, BWn) that is specific to a single band of the multiple supported bands (B1, B2, Bn). In this context, the tuned operation may include matching of the output of the amplifier to the input of a corresponding narrow band filter (141, 142, ..., 14n) over the relatively narrow frequency range of operation. This in turn allows for a better impedance match over the relatively narrow frequency range of operation as shown in the Smith chart of FIG. 4A, where an Impedance Match Locus is shown to be relatively close to an Optimal Impedance Point. On the other hand, since the wideband amplifier PA1n (121n) used to support multiple bands of operation (e.g. B1, B2, Bn) in the front-end (200) of FIG. 2 needs to be matched over a wider frequency range of operation, a corresponding Impedance Match Locus may be further away from the Optimal Impedance Point as depicted in the Smith chart of FIG. 4B. A person skilled in the art readily knows that a wideband amplifier, such as PA1n (121n) used in the front-end (200) of FIG. 2, may have a reduced performance when compared to a narrow band amplifier, such as any of (PA1, PA2, PAn) used in the front-end (100) of FIG. 1, for two reasons: first, a match loss in the wideband case is increased to attain a low Q match to achieve a wide bandwidth; and second, the match is skewed further away from an optimal match to attain the desired wide bandwidth (as shown in FIG. 4B).

Figure 5:
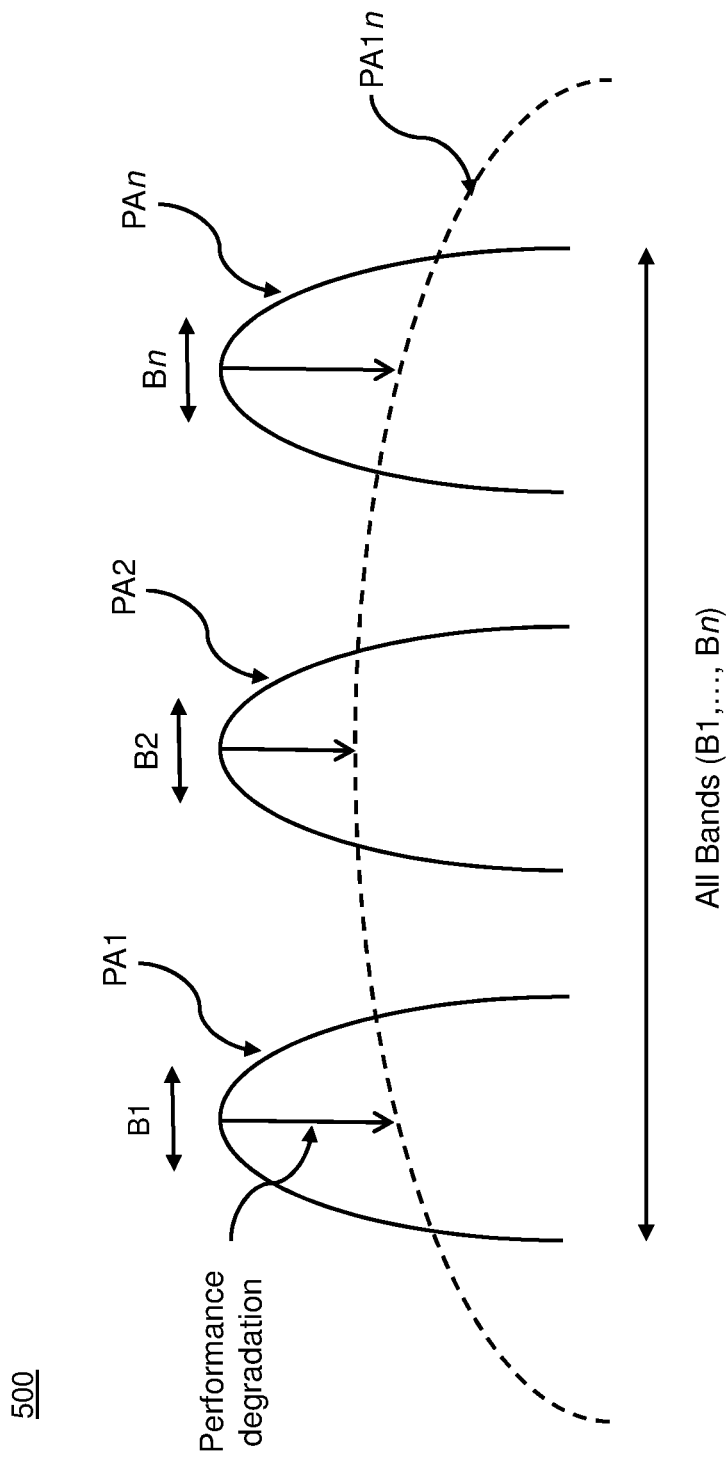
FIG. 5 shows performance graphs of the narrow band amplifiers and the wideband amplifier respectively used in the multi-band RF front-end stages of FIG. 1 and FIG. 2.

With reference to FIG. 5, performance graphs of the narrow band amplifier (PA1, PA2, PAn) used in the RF front-end (100) of FIG. 1 are contrasted to a performance graph of the wideband amplifier PA1n (121n) used in the front-end (200) of FIG. 2 over the supported bands of operation (B1, B2, Bn). Such performance graphs may represent any performance metric that considers a power output by the amplifiers, such as, for example, output power (Pout) or power added efficiency (PAE) of the amplifiers, where, in the case of the graphs depicted in FIG. 5, higher values are desired. As can be seen in the graphs of FIG. 5, there may be a substantial degradation of performance over any of the supported bands of operation (B1, B2, Bn) in the case of operation with the wideband amplifier PA1n (121n) when compared to operation with band specific narrow band amplifiers (PA1, PA2, PAn).

Figure 6:
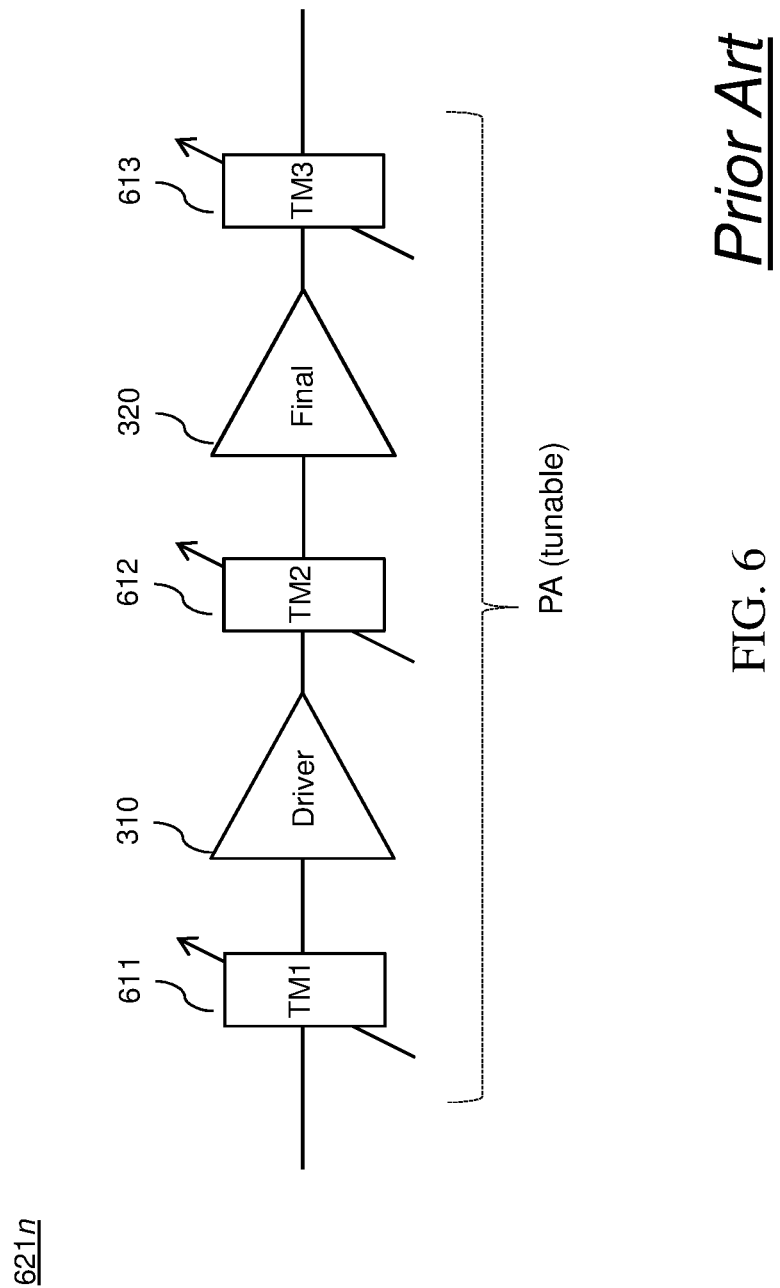
FIG. 6 shows an exemplary embodiment of a configurable RF amplifier module which can be configured to support any one of a plurality of bands.

Further improvement of the performance of the wideband amplifier PA1n may be obtained by specific tuning (i.e. configuring) of the wideband amplifier based on a frequency range of operation (BW1, BW2, BWn) of a selected band of operation (B1, B2, Bn) via the amplifier module (621n) depicted in FIG. 6. Papers referenced above in the Cross-Reference to related Tunable Circuits Applications, whose disclosures are incorporated herein by reference in their entirety, describe some exemplary implementations of tunable circuits and papers referenced above in the Cross-Reference to related Tunable Elements Applications, whose disclosures are incorporated herein by reference in their entirety, describe some exemplary implementations of tunable elements that can be used to tune such tunable circuits.

As can be seen in FIG. 6, tuning of the amplifier module (621n) may be provided via tunable match networks (TM1, TM2, TM3), also annotated in the figures as (611, 612, 613). Such tunable match networks (TM1, TM2, TM3) can be configured to selectively provide impedance matching amongst the various coupled stages of the amplifier module (621n) over a frequency range of operation (BW1, BW2, BWn) of a selected frequency band of operation (B1, B2, Bn). It should be noted that the exemplary configuration of the amplifier module (621n) of FIG. 6 having a given number of amplifiers (e.g. 310, 320) coupled via a given number of tunable match networks (e.g. TM1, TM2, TM3) should not be construed as limiting the scope of the present disclosure, as a person skilled in the art is well aware that other configurations of a configurable amplifier module having different number of amplifiers and different numbers of tunable match networks are also possible.

With continued reference to FIG. 6, It should be noted that each of the tunable match networks (TM1, TM2, TM3) may include a plurality of tunable elements, such as, for example, digitally tunable capacitors (DTCs), and digitally tunable inductors (DTLs), as described in the above referenced U.S. Pat. No. 9,024,700 B2 and U.S. Pat. No. 9,197,194 B2 whose disclosures are incorporated herein by reference in their entirety. Therefore, configuration control of each such tunable match network may comprise controlling of a plurality of tunable elements based on a selected frequency band of operation (B1, B2, Bn).

Figure 7:
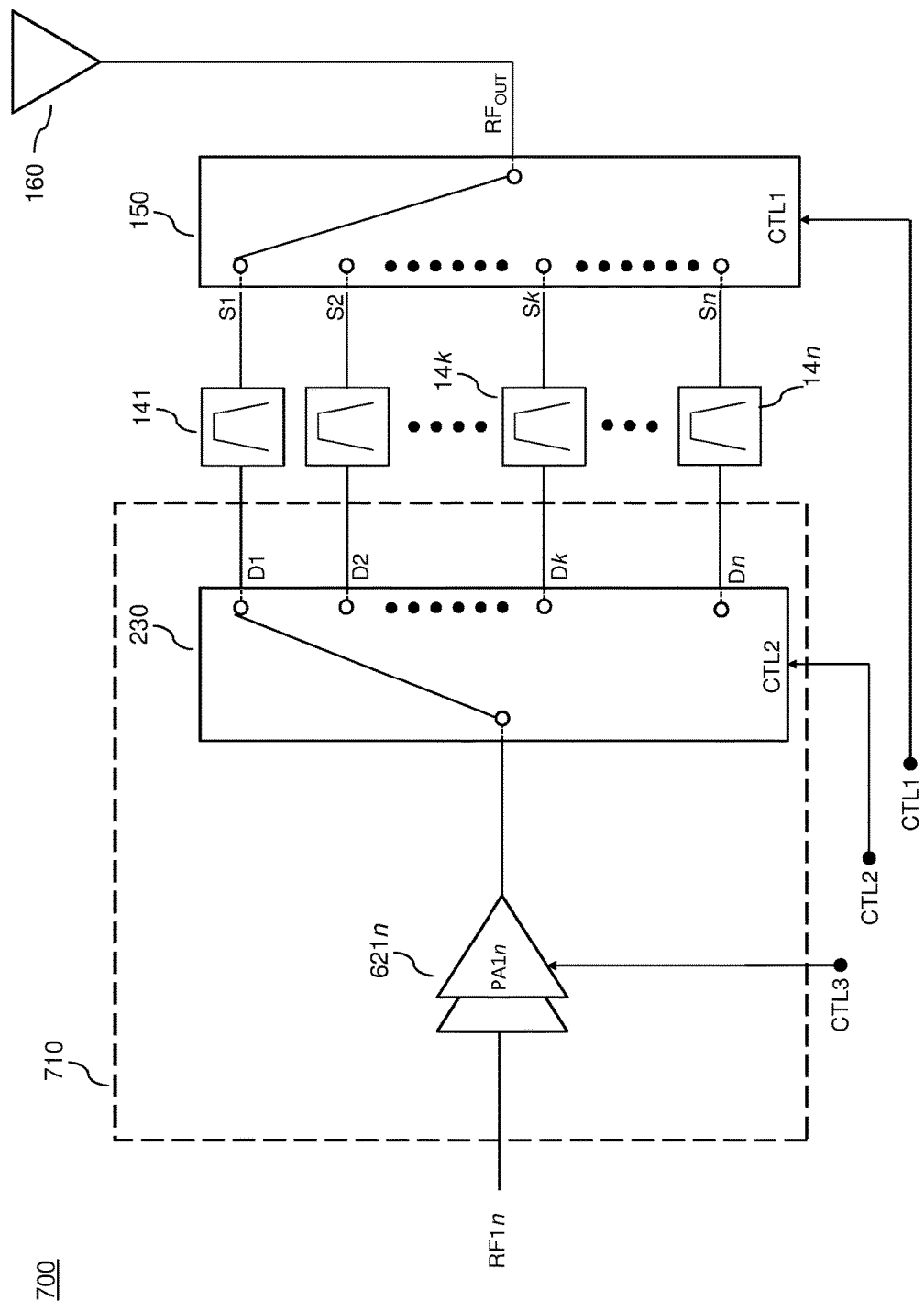
FIG. 7 shows a block diagram of transmit paths of a multi-mode RF front-end stage of an RF device, as used, for example, in a cellular phone, where the configurable RF amplifier module of FIG. 6 is used to support multiple bands.

FIG. 7 shows a simplified block diagram of transmit paths of an RF front-end stage (700) of an RF device which can be used for RF transmission of multiple modes and multiple frequency bands signals via the configurable RF amplifier module (621n) of FIG. 6. With the exception of usage of the configurable RF amplifier (621n) of FIG. 6 instead of the RF amplifier (300) of FIG. 3, other elements of the RF front-end stage (700) are similar to ones used in the RF front-end stage (200) of FIG. 2 and are therefore not described.

With continued reference to FIG. 7, the configurable RF amplifier (621n) is selectively tuned (e.g. impedance matched) according to a frequency range of operation (BW1, BW2, BWn) of a selected band of operation (B1, B2, Bn). For example, FIG. 7 depicts the exemplary operation over a first band of operation (e.g. B1), where: the content of the RF signal, RF1n, and the tuning of the amplifier PA1n (621n), is according to the frequency range of operation of the first band of operation (e.g. RFln=RF1, with frequency content per BW1); position of the band switch (230) is so to route the amplified RF signal to the narrow band pass filter (141) associated with the band of operation B1; and position of the antenna switch (150) is so to route the output of the filter (141) to the antenna (160) for transmission. In some implementations, the configurable amplifier PA1n (621n) and the band switch (230) may be monolithically integrated as single integrated circuit (710). It should be noted that configuration control signals (CTL1, CTL2, CTL3) are output by a signal-aware controller, such as, for example, a transceiver unit, that knows a selected band of operation of the RF front-end stage (700). This is shown in FIG. 8A.

Figure 8A:
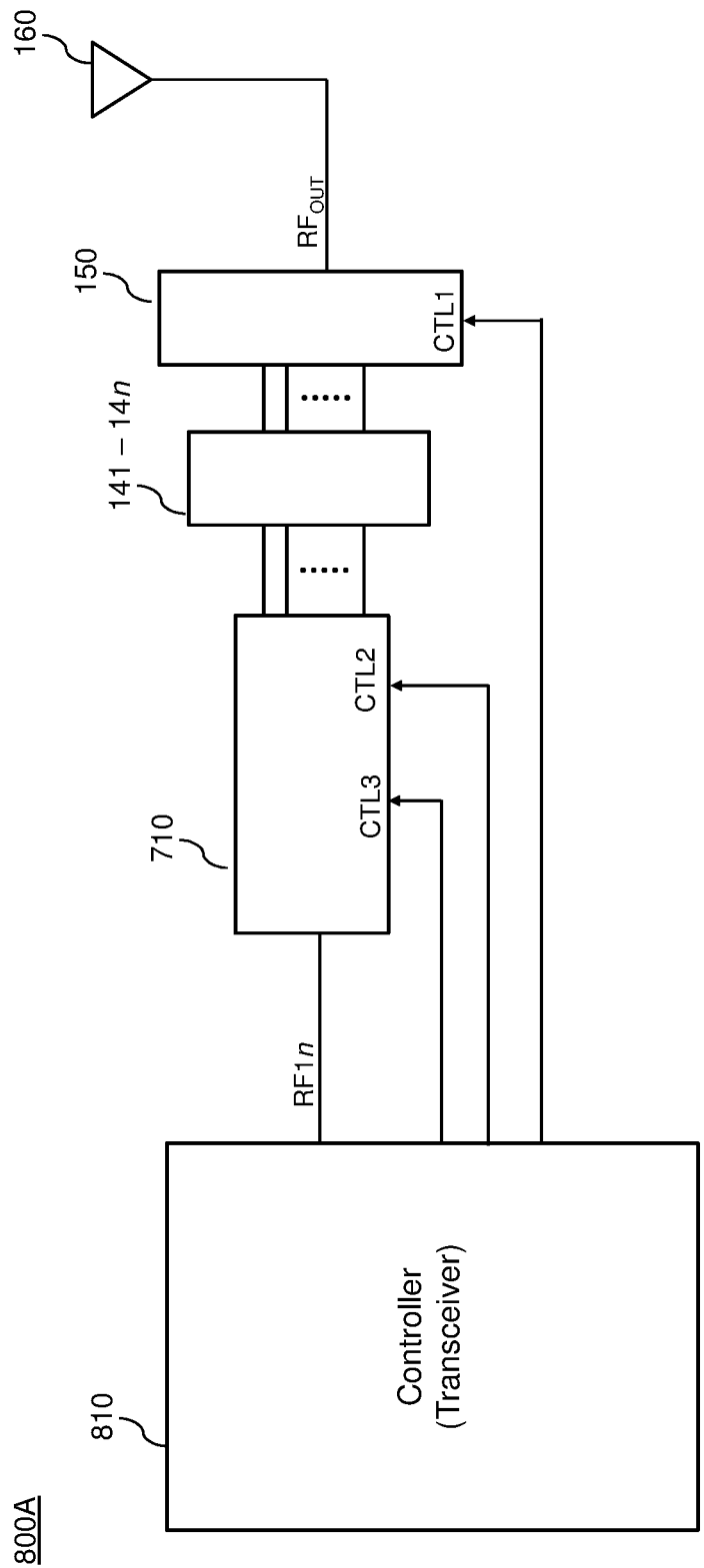
FIG. 8A shows additional details of a configuration control element to configure the configurable RF amplifier module depicted in FIG. 7.
Figure 8B:
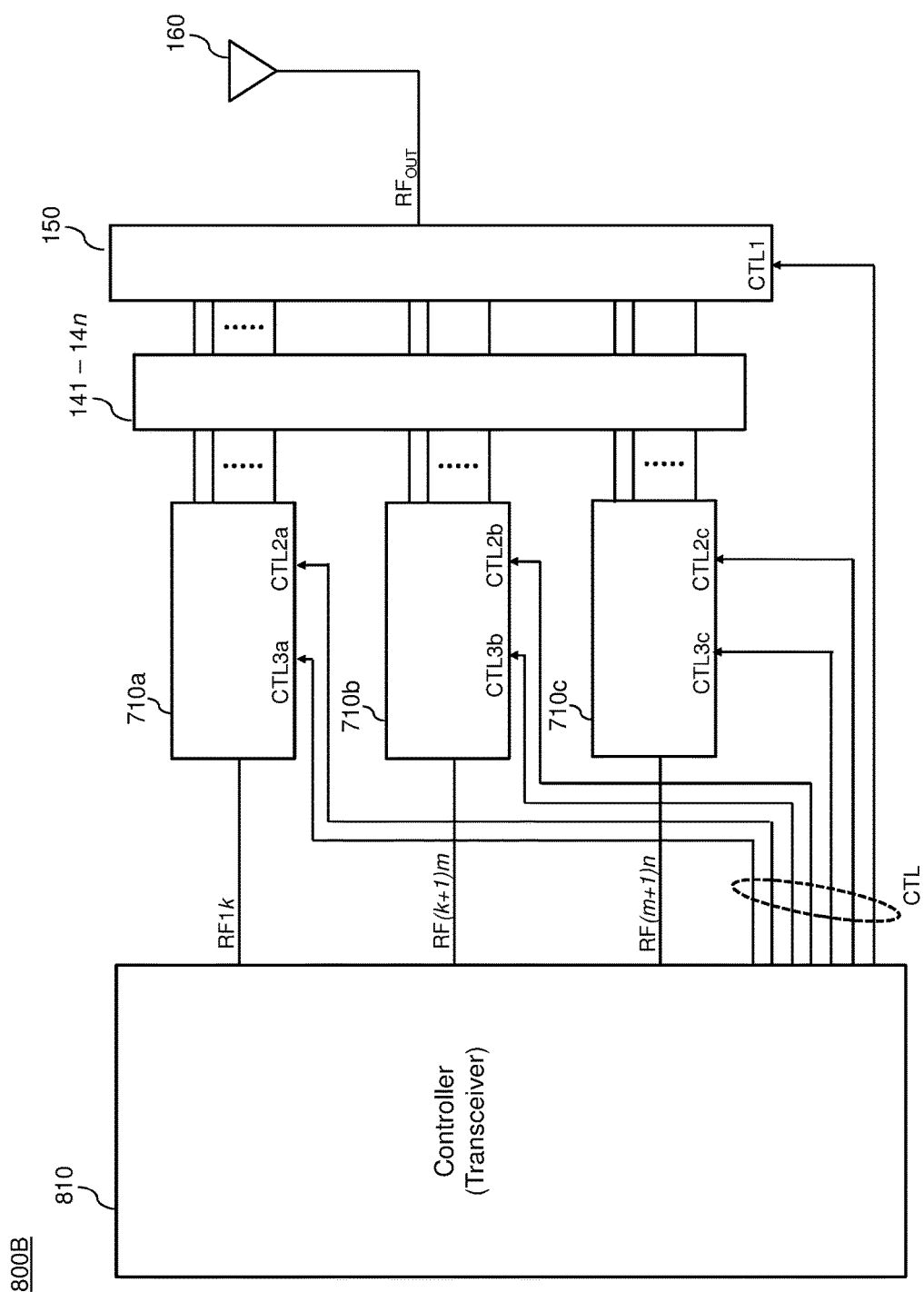
FIG. 8B shows a block diagram of transmit paths of a prior art multi-mode RF front-end stage of an RF device, as used, for example, in a cellular phone, where a plurality of configurable RF amplifier module as depicted in FIG. 6 are used to support multiple bands.

FIG. 8A shows additional details of a controller unit (810) that can be used to control operational configuration of the RF front-end stage (700) depicted in FIG. 7. A person skilled in the art readily knows that in a case of, for example, a cellular handset, such controller unit (810) is often the transceiver unit which is also in charge of generation of the RF signal, RF1n, to be transmitted.

FIG. 8B shows an extension of the configuration depicted in FIG. 8A, where the supported bands of operation (B1, B2, Bn) are grouped in different groups (e.g. 3 groups), each group operating via a configurable amplifier module and band switch (710a, 710b, 710c), similar to the configurable amplifier module and band switch (710) of FIG. 8A, that is selectively tuned for operation over a frequency range of operation of a selected band in the group. For example, as shown in FIG. 8B, the bands may be grouped according to three groups, respectively supporting bands (B1, Bk), (Bk+1, Bm) and (Bm+1, Bn).

With further reference to FIGS. 8A and 8B, under control of the controller unit (810), a configuration of the configurable elements (710, 710a, 710b, 710c), which include the configurable amplifier PA1n (621n) depicted in FIG. 6 and the switch mode (230) depicted in FIG. 7, and of the antenna switch (150), is controlled according to a selected band of operation (B1, B2, Bn). For example, as shown in FIGS. 8A and 8B, configuration control lines CTL3 are used to control configuration of the configurable amplifier PAn (621n), configuration control lines CTL2 are used to control configuration of the band switch (230), and configuration control lines CTL1 are used to control configuration of the antenna switch (150). A person skilled in the art would realize that such control would not be possible unless the controller unit (810) has full knowledge of specification of the configuration control of each of the configurable elements (710, 710a, 710b, 710c, 150), which in the case of the configurable amplifier PAn (621n), includes custom configuration control of plurality of tunable elements of each of the tunable match networks (TM1, TM2, TM3). A person skilled in the art would also realize that replacing the lower performance wideband amplifier PA1n (121n) of the RF front-end stage (200) of FIG. 2, with a higher performance configurable RF amplifier PA1n (621n) of FIG. 6 that can be tuned over an operating frequency range of a selected band, would not be possible, as no configuration control signals (e.g. CTL3) are provided in such configuration.

Figure 9:
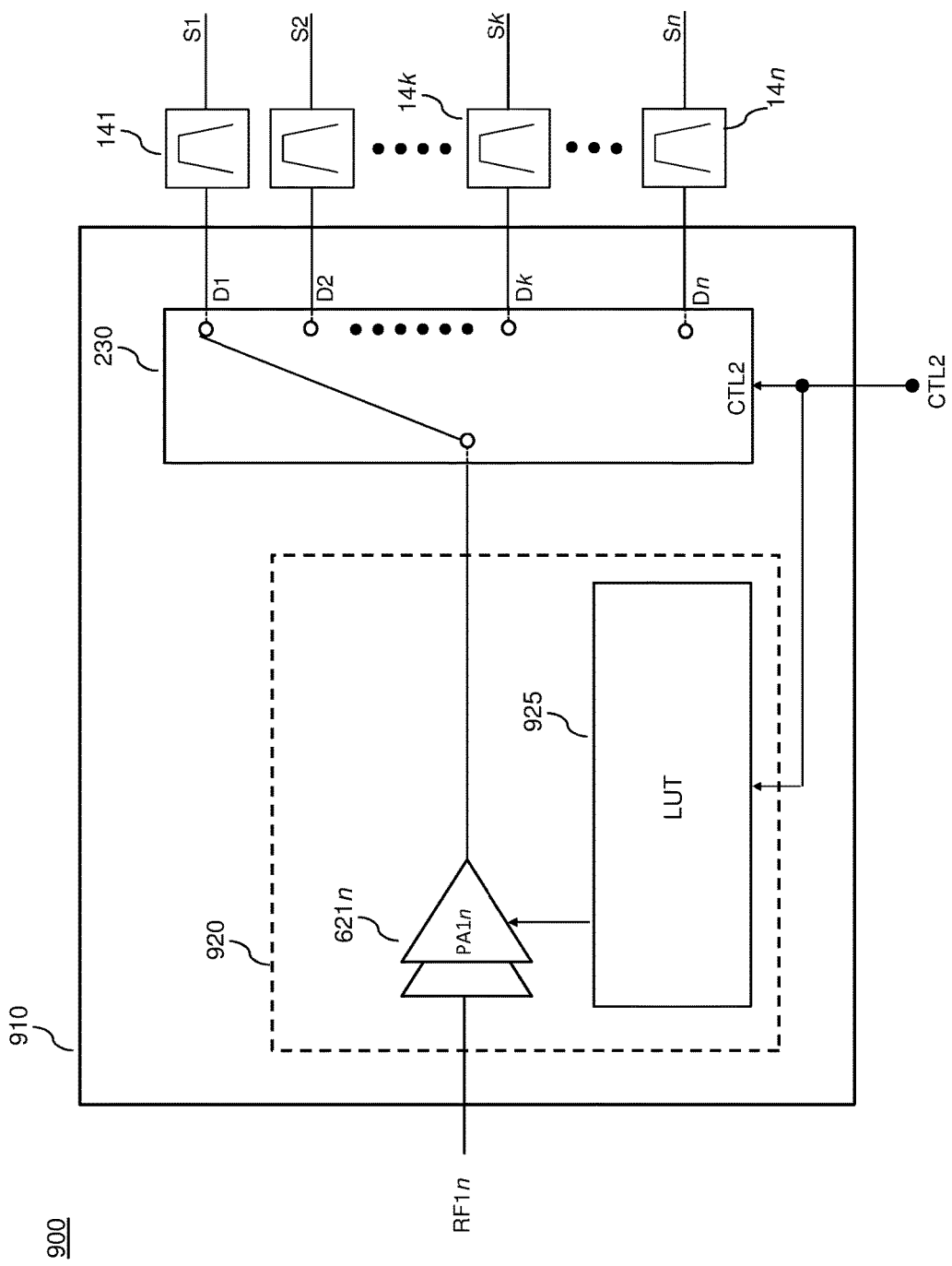
FIG. 9 shows a block diagram of transmit paths, according to an embodiment of the present disclosure, where a configurable RF amplifier module is used to support transmission of multiple bands signals.

As manufacturer of transceiver units (e.g. controller 810) may be reluctant in implementing specific custom configuration control for support of, for example, the configurable amplifier PA1n (621n) used in FIGS. 7, 8A and 8B, and as established RF front-end designs may be unable to provide such specific custom configuration control, there may be a desire to control configuration of the configurable RF amplifier PA1n (621n) without specific support from the transceiver unit (e.g. controller unit 810), as shown in FIG. 9.

FIG. 9 shows a simplified block diagram of transmit paths of an RF front-end stage (900) of an RF device which can be used for RF transmission of multiple modes and multiple frequency bands signals via the configurable RF amplifier module PA1n (621n) of FIG. 6, where configuration control of the configurable RF amplifier module PA1n (621n) is provided without specific support of a signal-aware controller (e.g. transceiver, FIGS. 8A, 8B). The RF front-end stage (900) can be therefore implemented in any new or existing design (cellular handset, tablet, etc.) that uses a grouped approach for supporting the various bands of operation (B1, B2, Bn) as depicted, for example, in FIGS. 2, 7, 8A and 8B, where a band switch (230) is present.

With further reference to FIG. 9, according to an embodiment of the present disclosure, configuration control of the band switch (230) setting (e.g. CTL2) can be used to control the configurable RF amplifier module PA1n (621n). As the configuration control signal CTL2 to the band switch (230) selects a narrow band filter (141, 142, . . . , 14n) included in a RF transmit path, a mapping between the selected filter and a band of operation (B1, B2, Bn) can be readily made via, for example, a priori knowledge or direct measurement of a frequency bandwidth of the selected filter. A person skilled in the art would realize that for a given RF front-end stage, such as the RF front-end stage (900) depicted in FIG. 9, the narrow band filters (141, 142, . . . , 14n) and the frequency bands (B1, B2, Bn) are linked via a one to one relationship (that is provided by the state of the band switch).

With continued reference to FIG. 9, a lookup table (LUT) (925) may be used to map configuration control data (e.g. data values of the control signal CTL2) of the band switch (230) to configuration control data for configuring (e.g. tuning) the configurable RF amplifier module PA1n (621n). Such mapping may be based on a frequency range of operation (BW1, BW2, BWn) of a band of operation (B1, B2, Bn) associated to the selected narrow band filter (141, 142, . . . , 14n). As described above with reference to FIG. 6, the configuring/tuning of the configurable RF amplifier PA1n (621n) may include configuring/tuning of one or more tunable match networks (e.g. TM1, TM2, TM3) via corresponding tunable elements (e.g. tunable capacitors, tunable inductors).

With further reference to FIG. 9, a person skilled in the art would realize that usage of a lookup table (925) for performing the mapping represents one exemplary embodiment according to the present disclosure which should not be construed as limiting the scope of the present disclosure, as other memory-based devices, such as write-once or write-many memory devices, random access memory devices, as well as non-memory devices, such as logic based circuits, may also be used in lieu of the lookup table (925).

With further reference to FIG. 9, a person skilled in the art would realize that a given setting of the band switch (230), via corresponding configuration control signal CTL2, may not necessarily correspond to a same selected band of operation of the RF front-end stage (900). For example, in one system (e.g. cellular handset, tablet) designed to operate in a first geographical region, the narrow band filter (141) may correspond to a first band of operation having a first frequency range of operation BW1, and in another system, designed to operate in a second geographical region different from the first one, the narrow band filter (141) may correspond to a first band of operation having a first frequency range of operation BW1' different from BW1. Because of the difference between BW1 and BW1', the band switch state associated with the path of BW1 or BW1' may be the same path but be used for different frequencies. In order to support operation in both such regions via a single monolithically integrated chip comprising at least the configurable amplifier PA1n (621n) and the lookup table (925), according to an embodiment of the present disclosure, the lookup table (925) may be a fusible lookup table. Such fusible lookup table may therefore be fused according to a region-specific mapping of the configuration control data of the band switch (230), CTL2, to configuration control data for configuring of the configurable RF amplifier module PA1n (621n). A person skilled in the art would realize that such fusing may be used to provide any specific mapping, not necessarily based on a geographical region.

With further reference to FIG. 9, according to some exemplary embodiments of the present disclosure, the lookup table (925) may include configuration control data for the configurable amplifier PA1n (621n) corresponding to a portion, or all, of known frequency bands of operation currently available. A person skilled in the art would know that such bands may correspond to several of known wireless standards. According to another exemplary embodiment of the present disclosure, the lookup table (925) may include configuration control data based on a limited number of frequency bands of operation, and/or based on a limited number of wireless standards. A person skilled in the art would appreciate the flexibility provided by the lookup table (925) which can allow any desired tuning of the configurable amplifier PA1n (621n) based on the configuration control data to the band switch (230).

According to an embodiment of the present disclosure, the configurable amplifier PA1n (621n) and the lookup table (925) may be monolithically integrated within one integrated circuit (e.g. 920 shown in FIG. 9). According to a further embodiment of the present disclosure, the configurable amplifier PA1n (621n), the lookup table (925), and the band switch (230) may be monolithically integrated within one integrated circuit (e.g. 910 shown in FIG. 9). Such integrated circuit (910, 920) may be used by system integrators in RF front-end architectures similar to one depicted in FIGS. 2, 7, 8A, and 8B to provide operation similar to the architecture depicted in FIG. 9, where configuration of the integrated circuit (910, 920) is controlled by the band switch (230) configuration control data, CTL2.

Figure 10:
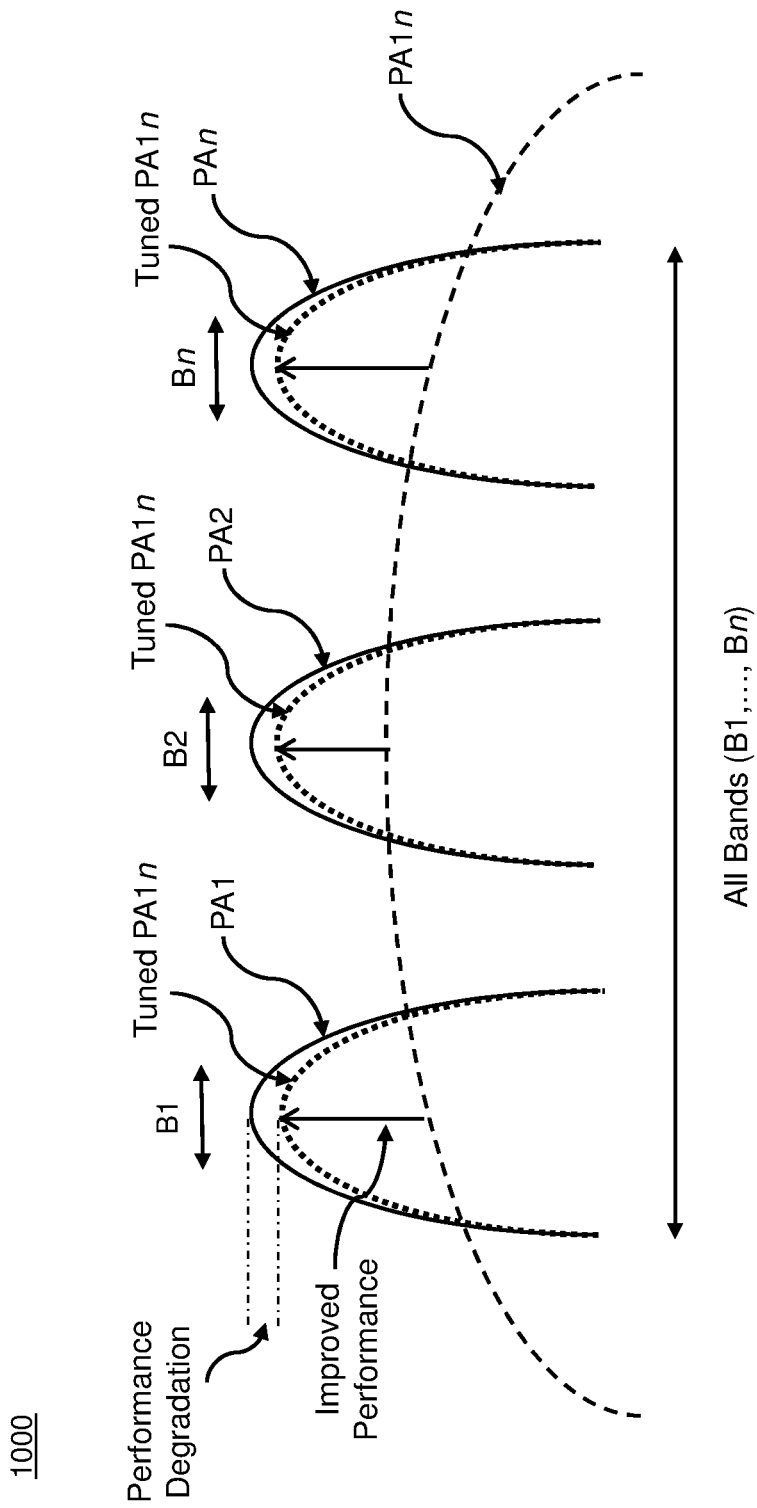
FIG. 10 shows performance graphs that contrast performance of the configurable RF amplifier module depicted in FIG. 9 to performances of the narrow band amplifiers and the wideband amplifier respectively used in the multi-band RF front-end stages of FIG. 1 and FIG. 2.

FIG. 10 shows performance graphs that contrast performance of the configurable RF amplifier module PA1n (621n) depicted in FIG. 9, to performances of the narrow band amplifiers (PA1, PA2, . . . , Pan) and the wideband amplifier PA1n (121n) respectively used in the multi-band RF front-end stages of FIG. 1 and FIG. 2 (as discussed with reference to FIG. 5). As described above with reference to FIG. 5, such performance graphs may represent any performance metric that considers a power output by the amplifiers, such as, for example, output power (Pout) or power added efficiency (PAE) of the amplifiers, where, in the case of the graphs depicted in FIG. 10 (and FIG. 5), higher values are desired. As can be seen in the graphs of FIG. 10, there may be a substantial degradation of performance over any of the supported bands of operation (B1, B2, Bn) in the case of operation with the wideband amplifier PA1n (121n) when compared to operation with band specific narrow band amplifiers (PA1, PA2, PAn). However, by virtue of configuring (tuning) the configurable amplifier module PA1n (621n) based on a selected frequency band of operation, a resultant closer impedance match locus to an optimal impedance point (as described above with reference to FIGS. 4A and 4B), can allow for an improved performance (annotated Improved Performance in FIG. 10) of the tuned PA1n (annotated Tuned PA1n in FIG. 10) with respect to the configuration using a wideband amplifier (PA1n) of FIG. 2. As can be seen in FIG. 10, such improved performance can approach the performance based on the configuration of FIG. 1 using narrow band amplifiers (PA1, PA2, PAn) to within a small performance degradation (annotated Performance Degradation in FIG. 10)

Figure 11:
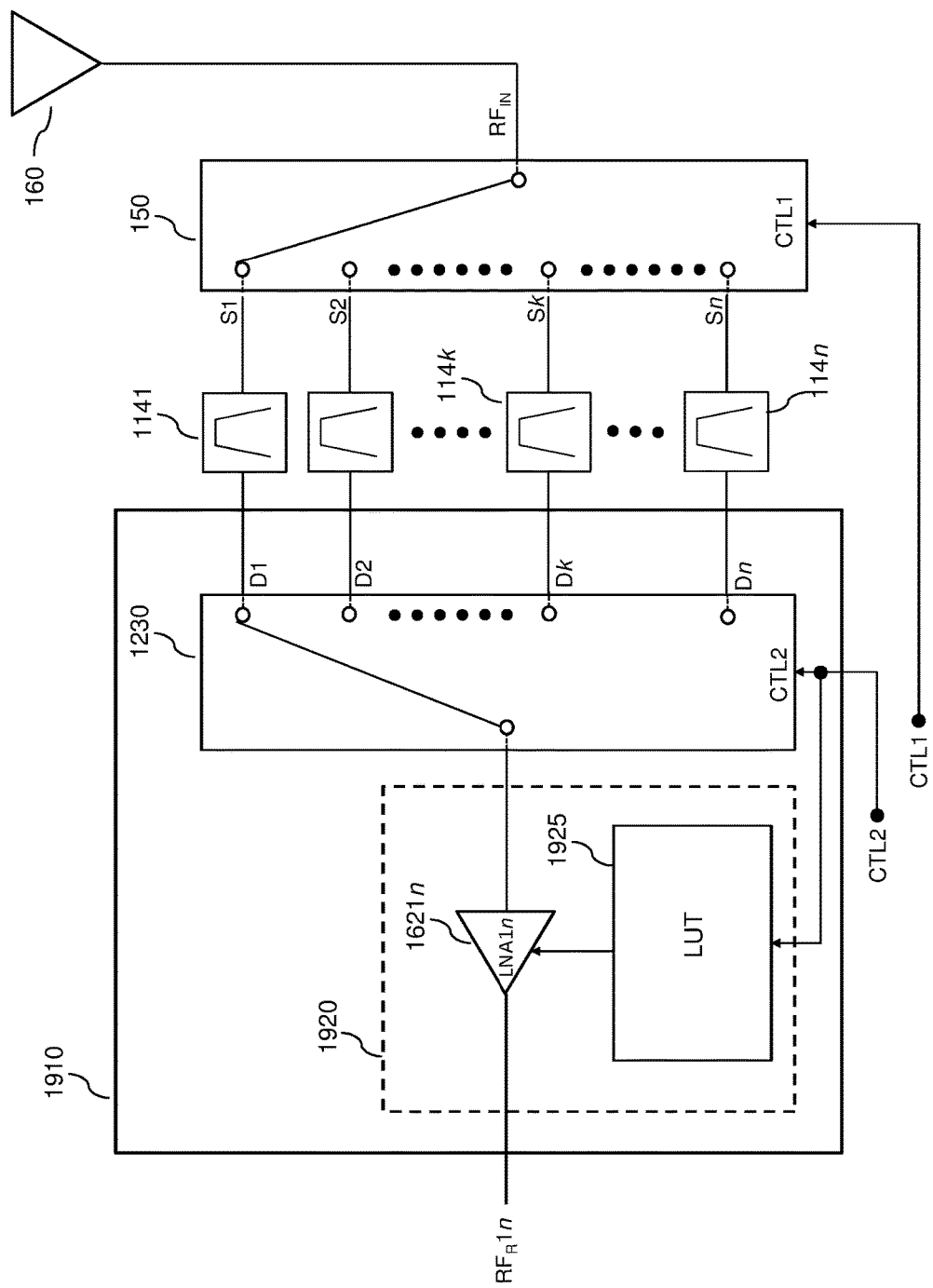
FIG. 11 shows a block diagram of receive paths, according to an embodiment of the present disclosure, where a configurable amplifier module is used to support reception of multiple bands signals

Based on the above description, a person skilled in the art would realize that tuning of an amplifier in a front-end stage of an RF system according to the present teachings may not be limited to tuning of a power amplifier of corresponding transmit paths, but also to tuning of a low noise amplifier (LNA) of corresponding receive paths, as shown in FIG. 11.

With reference to FIG. 11, a receive path portion of a front-end stage, such as, for example, the front-end stage (900) depicted in FIG. 9, is shown, where a configurable (low noise) amplifier, LNA1n (1621n), can be used for RF reception of multiple modes and multiple frequency bands signals. Configuration control of the configurable amplifier LNA1n (1621n) is provided without specific support of a signal-aware controller (e.g. transceiver, FIGS. 8A, 8B), and based on the configuration control of the band switch (1230). Narrow band filters (1141, 1142, . . . , 114n) may be part of a receive side of duplexer units used for receiving RF signals operating on frequency ranges corresponding to bands (B1, B2, Bn), where, as previously described, the transmit side of the duplexer units may be formed by, for example, the narrow band filters (141, 142, . . . , 14n) of FIG. 9. The lookup table (1925) shown in FIG. 11 may be part of the same lookup table (925) shown in FIG. 9, or may be a separate lookup table. According to an embodiment of the present disclosure, the configurable amplifier LNA1n (1621n) and the lookup table (1925) may be monolithically integrated within one integrated circuit (e.g. 1920 shown in FIG. 11). According to a further embodiment of the present disclosure, the configurable amplifier LNA1n (1621n), the lookup table (1925), and the band switch (1230) may be monolithically integrated within one integrated circuit (e.g. 1910 shown in FIG. 11). A person skilled in the art would realize that monolithic integration of any of the circuits shown in blocks (910, 1910) may be possible as well, depending on desired implementation goals.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A radio frequency (RF) circuital arrangement configured to process an RF signal for operation over a plurality of frequency bands, the circuital arrangement comprising:
   a configurable amplifier configured to be tuned according to any one of the plurality of frequency bands, the configurable amplifier comprising one or more tunable elements for tuning of the configurable amplifier;
   a band switch configured to selectively couple the configurable amplifier to a filter of a plurality of narrow band filters based on a switch control signal provided to the band switch, and
   a mapping circuit that is configured to map data values of the switch control signal to data values of configuration control signals for tuning of the one or more tunable elements,
   wherein the plurality of narrow band filters are respectively associated, in a one to one correspondence, to the plurality of frequency bands; and
   wherein a tuning of the configurable amplifier is based on the switch control signal.

2. The radio frequency (RF) circuital arrangement according to claim 1, wherein the one or more tunable elements comprise one or more of: a) a tunable capacitor, and b) a tunable inductor.

3. The radio frequency (RF) circuital arrangement according to claim 2, wherein the one or more tunable elements are arranged according to one or more tunable impedance match networks.

4. The radio frequency (RF) circuital arrangement according to claim 3, wherein the configurable amplifier comprises one or more amplifier circuits coupled to the one or more tunable impedance match networks.

5. The radio frequency (RF) circuital arrangement according to claim 1, wherein the tuning of the one or more tunable elements is based on a frequency range of operation of a frequency band associated to a filter of the plurality of narrow band filters that is selectively coupled to the configurable amplifier.

6. The radio frequency (RF) circuital arrangement according to claim 1, wherein the mapping circuit comprises at least one of: a) a memory circuit, and b) a logic circuit.

7. The radio frequency (RF) circuital arrangement according to claim 1, wherein the memory circuit comprises a lookup table.

8. The radio frequency (RF) circuital arrangement according to claim 7, wherein the lookup table is a fusible lookup table.

9. The radio frequency (RF) circuital arrangement according to claim 1, wherein the circuital arrangement is monolithically integrated.

10. The radio frequency (RF) circuital arrangement according to claim 1, wherein the configurable amplifier is one of: a) a power amplifier for transmission of the RF signal to an antenna, and b) a low noise amplifier for reception of the RF signal from the antenna.

11. A radio frequency (RF) device configured to transmit and receive RF signals according to a plurality of frequency bands, the device comprising at least one of:
   a) a configurable transmit path coupled to an antenna and configured to transmit RF signals according to the plurality of frequency bands, the configurable transmit path comprising the radio frequency (RF) circuital arrangement according to claim 1, wherein the configurable amplifier is a power amplifier; and
   b) a configurable receive path coupled to the antenna and configured to receive RF signals according to the plurality of frequency bands, the configurable receive path comprising the radio frequency (RF) circuital arrangement according to claim 1, wherein the configurable amplifier is a low noise amplifier.

12. The radio frequency (RF) device according to claim 11, wherein the plurality of narrow band filters of the RF circuital arrangement of the configurable transmit path, and the plurality of narrow band filters of the RF circuital arrangement of the configurable receive path, are arranged in pairs to form a plurality of duplexers configured to allow a duplex operation of the RF device over the plurality of frequency bands.

13. A method for increasing performance of a multi-band radio frequency (RF) device, the multi-band RF device operating over a plurality of frequency bands, the method comprising:
   determining a correspondence between data values of a switch control signal to a band switch and the plurality of frequency bands;
   providing a configurable amplifier that is configured to be tuned according to any one of the plurality of frequency bands;
   mapping the data values of the switch control signal to data values of a configuration control signal to the configurable amplifier;
   providing a memory circuit comprising the data values of the configuration control signal for each of the plurality of frequency bands;
   writing to the memory circuit for fusing the mapping based on the determining;
   and
   based on the mapping, tuning the configurable amplifier for operation over any one of the plurality of frequency bands, thereby increasing performance of the multi-band RF device.

14. The method according to claim 13, wherein:
   the multi-band RF device is configured to operate over the plurality of frequency bands based on a single wideband amplifier that is selectively coupled, via the band switch, to a plurality of narrow band filters that are in a one to one relationship with the plurality of frequency bands, and
   the providing of the configurable amplifier comprises replacing the single wideband amplifier with the configurable amplifier.

* * * * *